(12) United States Patent
Murata et al.

(10) Patent No.: US 7,098,701 B2
(45) Date of Patent: Aug. 29, 2006

(54) RECEIVING APPARATUS AND TRANSMISSION APPARATUS UTILIZING THE SAME

(75) Inventors: Makoto Murata, Kyoto (JP); Shinichi Saitoh, Kyoto (JP)

(73) Assignee: Rohm Co., Ltd., (JP)

( * ) Notice: Subject to any disclaimer, the term of this patent is extended or adjusted under 35 U.S.C. 154(b) by 106 days.

(21) Appl. No.: 10/890,464

(22) Filed: Jul. 12, 2004

(65) Prior Publication Data

US 2005/0036561 A1 Feb. 17, 2005

(30) Foreign Application Priority Data

Aug. 13, 2003 (JP) .............................. 2003-207526

(51) Int. Cl.
*H03B 1/00* (2006.01)
(52) U.S. Cl. ..................... 327/108; 327/333; 375/219
(58) Field of Classification Search ................ 327/108, 327/112, 333; 370/278, 282; 375/219
See application file for complete search history.

(56) References Cited

U.S. PATENT DOCUMENTS 5,471,498 A * 11/1995 Kuo ............................ 375/295
6,456,111 B1 * 9/2002 Yamaguchi ................... 326/86

FOREIGN PATENT DOCUMENTS

JP 3-283741 12/1991
JP 2001-053598 2/2001

OTHER PUBLICATIONS

Copy of Japanese Office Action dated Dec. 13, 2005.

* cited by examiner

*Primary Examiner*—Dinh T. Le
(74) *Attorney, Agent, or Firm*—Cantor Colburn LLP

(57) ABSTRACT

A first receiving terminal and a second receiving terminal are connected to a first signal transmission line and a second signal transmission line, respectively, and receive the input of transmission signals. A first resistor and a second resistor convert current signals contained in the transmission signals into voltage. A comparator inputs the respective voltages converted by the first and the second resistor, and outputs, as an output signal, a voltage corresponding to a difference between their voltages. A first transistor connected to an end of the first resistor and a second transistor connected to an end of the second resistor reduce the variation in a transmission voltage signal due to the variation in the current signals contained in the transmission signals. A third transistor connected to the other end of the first resistor causes to drop power-supply voltage so as to generate a control signal. The control signal is turned into a gate voltage of the second transistor in a crosswise manner. A fourth transistor connected to the other end of the second resistor operates in the similar manner to the third transistor.

20 Claims, 10 Drawing Sheets

250

RECEIVING APPARATUS AND TRANSMISSION APPARATUS UTILIZING THE SAME

BACKGROUND OF THE INVENTION

1. Field of the Invention

The present invention relates to receiving apparatuses and transmission apparatuses utilizing the same, and it particularly relates to a receiving apparatus using the current as a means for transmitting signals and a transmission apparatus utilizing the same.

2. Description of the Related Art

An electronic device is generally made up of a plurality of circuits, such as a central processing unit and semiconductor integrated circuits. For instance, a cellular phone is composed of a communication circuit, a display and an image shooting device. The circuits constituting an electronic device perform their respective processings; that is, a communication circuit carries out communication processing, a display displays predetermined types of information, and an image shooting device carries out image processing. And these circuits further process transmission of signals to and from the other circuits. The image shooting device, for example, transmits data of images shot to the communication circuit. And in the transmission of signals between circuits, the medium used in the conventional practice has been voltage, which changes its value between the power-supply voltage and the ground voltage. However, as the use of higher operating speeds for circuits and larger-capacity processing of signals by a central processing unit has increased in recent years, the signal transmission by means of the voltage began to pose a problem as mentioned below when raising the processing speed for signal transmission between circuits.

In general, a signal transmission line between circuits has a capacitance, and an electric charge is charged or discharged according to the capacitance when the voltage changes. Hence, transmission of signals by the medium of voltage involves extra time for charging and discharging the electric charge due to the capacitance. As a result, the time taken for the rise and fall of signals makes it difficult to achieve the high-speed signal transmission. To solve this problem, a signal transmission technology has been proposed in which current, instead of voltage, is used in transmitting signals.

Related Art List (1) Japanese Patent Application Laid-Open No. 2001-53598.

Transmission of signals by the medium of current does not require the generation of a significant potential difference as in the case of signal transmission by the medium of voltage. This will result in a reduced amount of electric charge to be charged and discharged, thus making it possible to achieve higher speeds for signal transmission. However, to further raise the speed of signal transmission by current, it is preferable that the voltage variation to be caused by the signal transmission by current be further reduced.

In the case of a foldable cellular phone whose structure is such that the casing is separated into a part including a display and an image shooting device and another part including a communication circuit, the signal transmission lines are arranged such that they are positioned on both sides of the movable mechanism therebetween. As the amount of data to be transmitted increases due to the higher accuracy of the image shooting device and so forth, the number of signal transmission lines to be provided tends to increase accordingly. However, the number of the lines must be held low in consideration of the degree of freedom in arrangement of the signal transmission lines at the movable mechanism, which performs folding or rotating motion. In general, as the number of signal transmission lines decreases, the reliability of the movable mechanism which performs complex operations is raised. As a result of reduction in the number of signal transmission lines, a higher speed of signal transmission is required for each of the signal transmission line.

SUMMARY OF THE INVENTION

The present invention has been made in view of the foregoing circumstances and an object thereof is to provide a receiving apparatus capable of high-speed data transmission by reducing the variation in voltage signals on signal transmission lines and a transmission apparatus utilizing the same.

A preferred embodiment according to the present invention relates to a receiving apparatus. This receiving apparatus includes: an input unit which inputs a first input signal and a second input signal, respectively; an output signal generator which generates a first output signal from a current signal of the first input signal and which generates a second output signal from a current signal of the second input signal; a first control signal generator which generates a first control signal where a reference voltage is dropped by a potential difference which is generated by delivering the current signal of the first input signal; a second control signal generator which generates a second control signal where the reference voltage is dropped by a potential difference which is generated by delivering the current signal of the second input signal; a first voltage adjusting unit which adjusts, by the second control signal, the magnitude of a voltage signal of the first input signal in the input unit according to the magnitude of the current signal of the first input signal; and a second voltage adjusting unit which adjusts, by the first control signal, the magnitude of a voltage signal of the second input signal in the input unit according to the magnitude of the current signal of the second input signal.

The "reference voltage" may be power-supply voltage, for instance, and may also be other voltage whose value is predetermined.

By employing the above receiving apparatus, the magnitude of the voltage signal is adjusted by the first control signal or second control signal according to the current signal. Thus, the magnitude of the voltage signal according to the variation in the magnitude of the current signal can be adjusted.

The output signal generator may cause a reference voltage to drop by a potential difference, which is generated by the current signal of the first input signal, and generate the first output signal in a manner such that a voltage value thereof is equal to or less than that of the first control signal and the output signal generator also may cause the reference voltage to drop by a potential difference, which is generated by the current signal of the second input signal, and generate the second output signal in a manner such that a voltage value thereof is equal to or less than that of the second control signal.

A circuit having a resistance value by which to generate the potential difference in the "output signal generator" may be comprised of not only a circuit other than the circuit having a resistance value by which to generate the potential difference in the "first control signal generator" or the "second control signal generator" but also may be comprised of the circuit, having a resistance value in the "first control signal generator" or the "second control signal generator", combined with other circuit or circuits having resistance values.

The first input signal and the second input signal inputted to the input unit are differential signals which are generated from an original signal that fluctuates and which are complementary to each other. When the current signal of the first input signal becomes small, the first control signal generator may generate the first control signal in such a manner that voltage of the first control signal is made large, whereas when the current signal of the second input signal becomes small, the second control signal generator may generate the second control signal in such a manner that voltage of the second control signal is made large. When the current signal of the first input signal becomes small, the first voltage adjusting unit may adjust to diminish a variation in the magnitude of the voltage signal of the first input signal in the input unit in such a manner that the second control signal whose voltage is made large by the second control signal generator is applied to the voltage signal of the first input signal in the input unit, whereas when the current signal of the second input signal becomes small, the second voltage adjusting unit adjusts to diminish a variation in the magnitude of the voltage signal of the second input signal in the input unit in such a manner that the first control signal whose voltage is made large by the first control signal generator is applied to the voltage signal of the second input signal in the input unit. The receiving apparatus may further include an output unit which generates, from a potential difference between the first output signal and the second output signal, a third output signal corresponding to the first and second signals and which outputs the third output signal.

The "differential signals" indicate two signals where one signal is of the inverted value of the other, in general. This inversion relationship may be not only positive-negative or positive values and zero values but also two predetermined values such as 3V and 5V and any arbitrary relations as long as the two values are predefined ones.

Another preferred embodiment according to the present invention relates to a transmission apparatus. This transmission apparatus includes: a first switch unit which outputs a first transmission signal to a first transmission line by switching the first switch itself on according to an original signal; a second switch which outputs a second transmission signal to a second transmission line by alternately switching on the first switch unit and the second switch itself; a main current supply unit which delivers drive current that actuates the first switch unit or the second switch unit which is switched on; a subordinate current supply unit which delivers complementary drive current to the first transmission line and the second transmission line regardless of operation by the first switch unit and the second switch unit; an output unit which generates an output signal corresponding to the original signal from a potential difference between a first intermediate signal generated from a current signal of the first transmission signal and a second intermediate signal generated from a current signal of the second transmission signal and which outputs the thus generated output signal; a first control signal generator which generates a first control signal where a reference voltage is dropped by a potential difference generated by delivering the current signal of the first transmission signal; a second control signal generator which generates a second control signal where the reference voltage is dropped by a potential difference generated by delivering the current signal of the second transmission signal; a first voltage adjusting unit which adjusts, by the second control signal, the magnitude of a voltage signal of the first transmission signal in the first transmission line according to the magnitude of the current signal of the first transmission signal; and a second voltage adjusting unit which adjusts, by the first control signal, the magnitude of a voltage signal of the second transmission signal in the second transmission line according to the magnitude of the current signal of the second transmission signal.

By employing the above transmission apparatus, the magnitude of the voltage signal is adjusted by the first control signal or second control signal according to the magnitude of the current signal, so that the magnitude of the voltage signal in response to the magnitude of the current signal can be adjusted. Moreover, the relationship between the current signal of the first transmission signal and that of the second transmission signal is such that as one becomes large, the other becomes small and vice versa. Thus, the adjustment can be made to diminish the variation in the first transmission signal and second transmission signal.

It is to be noted that any arbitrary combination of the above-described structural components and expressions changed between a method, an apparatus, a system, a computer program, a recording medium having stored computer programs therein, a data structure and so forth are all effective as and encompassed by the present embodiments.

Moreover, this summary of the invention does not necessarily describe all necessary features so that the invention may also be sub-combination of these described features.

DETAILED DESCRIPTION OF THE INVENTION

Figure 1:
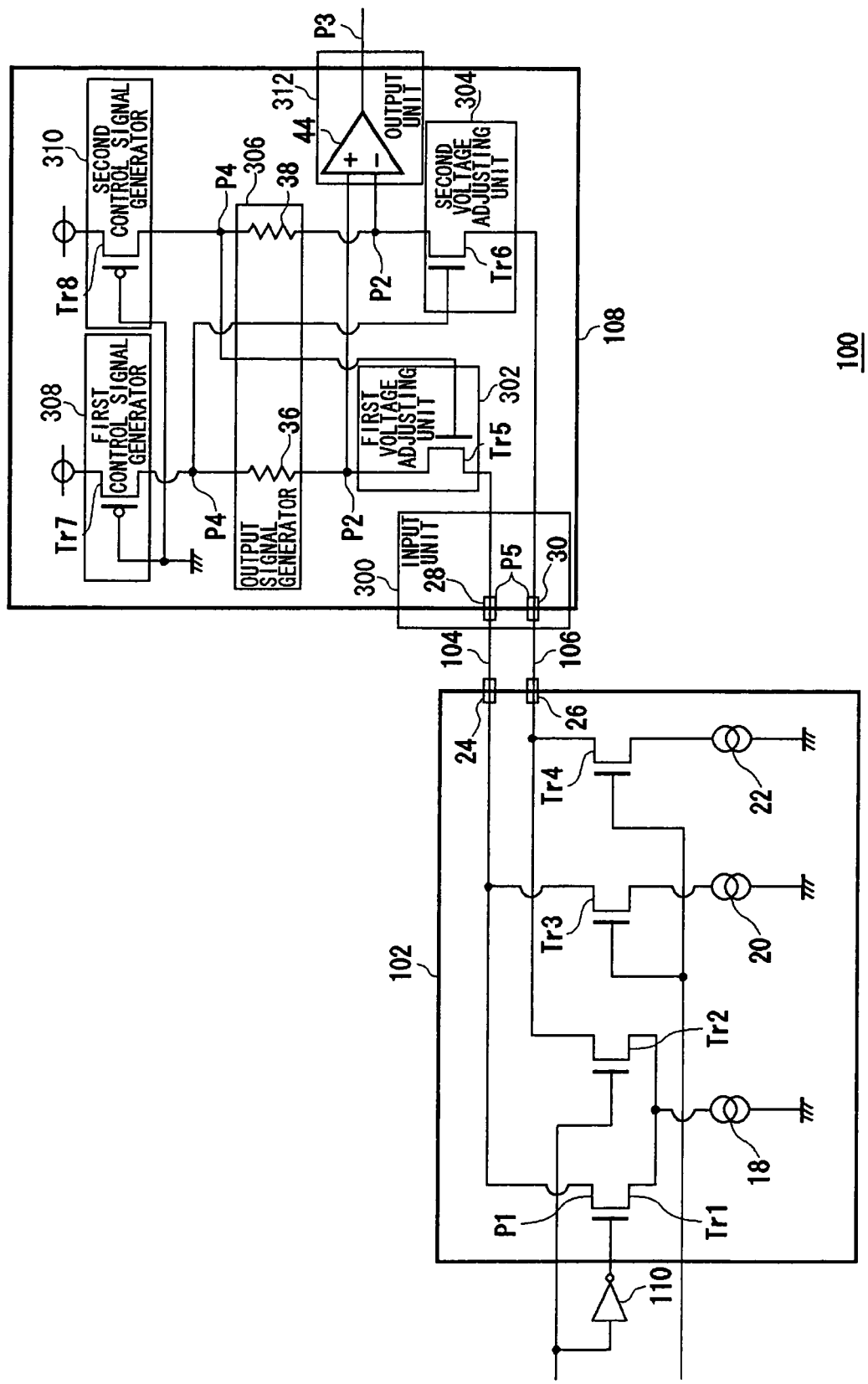
FIG. 1 shows a structure of a transmission apparatus according to a first embodiment of the present invention.

The invention will now be described based on the following embodiments which do not intend to limit the scope of the present invention but exemplify the invention. All of the features and the combinations thereof described in the embodiments are not necessarily essential to the invention.

First Embodiment

A first embodiment according to the present invention relates to a signal transmission technology whereby signals are transmitted between a plurality of circuits in an electronic device, such as between a camera unit and a communication circuit in a cellular phone, and it relates more particularly to a technology for transmitting differential signals. A manufacturer of cellular phones may use a reduced number of signal transmission lines according to the present embodiments and design the arrangement thereof on a substrate that constitutes a cellular phone. A transmitting apparatus according to the present embodiment converts signals to be transmitted into differential current signals by two transistors and outputs the current signals to signal transmission lines. The receiving apparatus inputs the signals from the signal transmission lines (hereinafter referred to as "transmitted signals" or "transmission signals", and the term "input" used even when the direction of the current signal contained in the transmitted signals is the direction of output to the signal transmission line from the receiving apparatus), converts the current signals contained in the transmitted signals into their respective voltage signals by resistance circuits, and outputs them after converting the voltage signals, which are differential signals, into a voltage signal, which is based on such absolute voltage as ground voltage.

To realize a high-speed transmission of signals, the transmitting apparatus causes a steady current to flow through the signal transmission lines, in addition to the above-mentioned transmitted signals, so as to reduce variations in the voltage signals contained in the transmitted signals. As a result, the operating range of the transistors, to be described below, included in the receiving apparatus can be shifted to a range with smaller voltage variation. The receiving apparatus clamps the transmitted signals by transistors, the source and drain of which are connected between the respective input terminals for the transmitted signals and the resistance circuits, thereby reducing the variations in the voltage signals contained in the transmitted signals. Furthermore, the receiving apparatus generates control signals respectively according to the magnitude of the current signals contained in the transmitted signals. The control signal generated from one current signal of differential current signals is inputted to the gate voltage of the other transistor for clamping. Hence, when the magnitude of the one current signal contained in the transmitted signals varies, the variation in the magnitude of the other voltage signal is adjusted so as to reach or be close to a predetermined value.

Herein, the magnitude of a current signal or the magnitude of a voltage signal means an absolute value of the signal.

As a result, when one of the current signals of the transmitted signals, which are differential signals, becomes large, the other of the current signals becomes small. Accordingly, with a rise in the current signal in a transmitted signal, the gate voltage of the transistor for clamping rises, too. Since the components related to the current signal and the rise in the gate voltage are in the directions that cancel out each other, the variations in the voltage signals in the transmitted signals become smaller.

FIG. 1 illustrates a structure of a transmission apparatus according to a first embodiment of the present invention. A transmission apparatus 100 includes a transmitting apparatus 102, a first signal transmission line 104, a second signal transmission line 106, a receiving apparatus 108 and an inverter 110. The transmitting apparatus 102 includes transistors Tr1 through Tr4, a constant-current source 18, a constant-current source 20, a constant-current source 22, a first transmitting terminal 24 and a second transmitting terminal 26, whereas the receiving apparatus 108 includes transistors Tr5 through Tr8, a first receiving terminal 28, a second receiving terminal 30, a first resistor 36, a second resistor 38 and a comparator 44. An input unit 300 corresponds to the first receiving terminal 28 and the second receiving terminal 30. An output signal generator 306 corresponds to the first resistor 36 and the second resistor 38. A first control signal generator 308 corresponds to the transistor Tr7 whereas a second control signal generator 310 the transistor Tr8. A first voltage adjusting unit 302 corresponds to the transistor Tr5 whereas a second voltage adjusting unit 304 the transistor Tr6. An output unit 312 corresponds to the comparator 44.

The inverter 110 inverts a signal to be transmitted and then outputs the inverted signal. As a result, an inverted signal to be transmitted which is outputted from the inverter 110 and a signal to be transmitted which has not been inputted to the inverter 110 constitute a differential signal. It is to be noted that the inverter 110 may be provided inside the transmitting apparatus 102.

The transistors Tr1 and the transistor Tr2, which are both an n-channel field-effect transistor, have a switching function that operates according to the differential signal. The transistor Tr1 and the transistor Tr2 repeat on and off alternately so that a gate terminal of the transistor Tr2 can input a signal to be transmitted and a gate terminal of the transistor Tr1 can input a signal to be transmitted which has been inverted by the inverter 110. The constant-current source 18 causes a constant drive current to flow, the first transmitting terminal 24 connects to the first signal transmission line 104, which is external thereto, and the second transmitting terminal 26 connects to the second signal transmission line 106, which is external thereto.

Source terminals of the transistor Tr1 and the transistor Tr2 are both connected to the constant-current source 18, a drain terminal of the transistor Tr1 is connected to the first transmitting terminal 24, and a drain terminal of the transistor Tr2 is connected to the second transmitting terminal 26. With the on and off of the transistor Tr1 and the transistor Tr2, current from the constant-current source 18 flows to the first signal transmission line 104 and the second signal transmission line 106 alternately. Hereinbelow, the signals transmitted through the first signal transmission line 104 and the second signal transmission line 106 are referred to as "a transmitted signal" or "transmission signals" (equivalently, "a transmission signal" or "transmission signals"), but the term should be understood to represent not only either one of the signals but also generically both of the signals. Also, the transmitted signals are understood to contain both voltage signals and current signals.

The constant-current source 20 sends current to the first signal transmission line 104 via the transistor Tr3. Since the transistor Tr3 is constantly on, a predetermined level of current is always present in the current signals contained in the transmitted signals through the first signal transmission line 104 irrespective of the on or off of the transistor Tr1. The constant-current source 22, operating in the similar manner to the constant-current source 20, sends current to the second signal transmission line 106 via the transistor Tr4.

The first receiving terminal 28, which is connected to the first signal transmission line 104, inputs transmitted signals. Likewise, the second receiving terminal 30, which is connected to the second signal transmission line 106, inputs transmitted signals. Here, voltage signals contained in the transmitted currents are also referred to as "transmitted voltage signals".

The first resistor 36 converts current signals contained in the transmitted signals into voltages. If the effect of the transistor Tr7 to be described later is to be disregarded, then the voltage V1 after the conversion by the first resistor 36 can be written as $$V1 = VDD - RI \quad \text{Equation (1)}$$

where R is the resistance value of the first resistor 36, VDD is the voltage value of the power-supply voltage, and I is the current signal.

Hence, when the current signal becomes large, a voltage V1 is outputted to make it smaller. The second resistor 38 operates in the similar manner to the first resistor 36. However, current signals coming to the first resistor 36 and the second resistor 38 constitute a differential signal, so that the larger the voltage after the conversion by the first resistor 36 is, the smaller the voltage after the conversion by the second resistor 38 will be.

The comparator 44 receives the input of the voltages after conversion by the first resistor 36 and the second resistor 38, respectively, and outputs a voltage according to the difference between the two voltages as an output signal. This output signal corresponds to the signal to be transmitted which has been inputted to the transmitting apparatus 102.

The transistor Tr5 reduces variation in transmitted voltage signals due to the variation in the current signals contained in transmitted signals. When the transistor Tr5 is used in a saturation region, the transmitted voltage signal, namely, the source voltage V2 of the transistor Tr5, can be written as $$V2 = VG - V - Vth - \sqrt{I/C} \quad \text{Equation (2)}$$

where VG is a gate voltage of the transistor Tr5, Vth is a threshold voltage of the transistor Tr5, and C is a constant representing the characteristics of the transistor Tr5.

The difference between the above V1 and V2 is that whereas V1 changes in proportion to I, V2 changes in proportion to the square root of I. That is, the variation in V2 due to the variation in the current signal I is smaller than the variation in V1. The transistor Tr6 operates in the similar manner to the transistor Tr5.

The transistor Tr7 is a p-channel field-effect transistor, the gate terminal of which is grounded. In a similar manner to the first resistor 36, the transistor Tr7 has a function of lowering the power-supply voltage according to the current signal. Where R' is a resistance value of the transistor Tr7, the voltage V3 as a result of voltage dropping by the transistor Tr7 can be written as $$V3 = VDD - R'I \quad \text{Equation (3)}$$

It is to be noted that R' of the transistor Tr7 is set lower than R of the first resistor 36 so as to prevent oscillation with the result that the voltage drop by V3 is smaller than that by V1. Thus the voltage V3 according to the current signal is turned into a gate voltage of the transistor Tr6 in a crosswise manner as a control signal. On the other hand, the transistor Tr8, which operates the same way as the transistor Tr7, generates a control signal, which is to become a gate voltage of the transistor Tr5. Here, if the current signal at the transistor Tr8 is I' and it is taken into account that V3, having been changed according thereto, is the gate voltage VG of the transistor Tr5, then the source voltage of the transistor Tr5 is written as V4, in substitution for V2, as follows:

$$V4 = VDD - R'I' - Vth - \sqrt{I/C} \quad \text{Equation (4)}$$

Here, I' and I, which are differential signals, are in a mutual relationship such that if one of them becomes large, the other becomes small. As a result, when the current signals contained in transmitted signals fluctuate, both I and I' are taken into account, so that the variation in the transmitted voltage signal V4 is reduced.

Figure 2A:
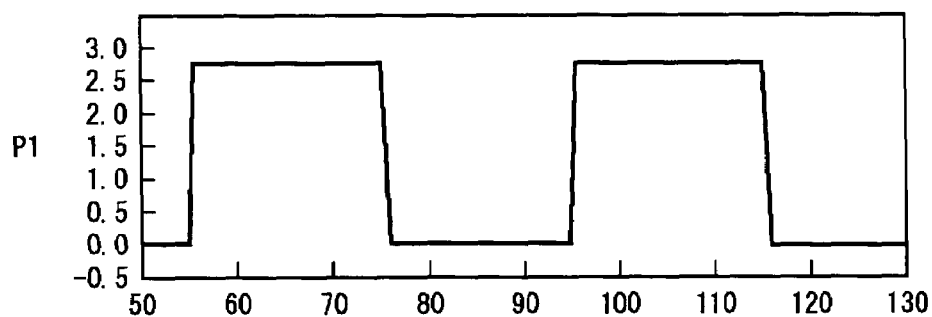
FIGS. 2A to 2E illustrate waveforms of signals at P1 to P5 of FIG. 1, respectively.

With reference to the waveforms of signals at different positions in a receiving apparatus 122 illustrated in FIG. 2A through 2E, a description is given of the operation of a transmission apparatus 100 of the above-described structure. It is to be noted that FIGS. 2A to 2E correspond to the signal waveforms at P1 to P5 shown in FIG. 1, wherein the vertical axis represents voltage and the horizontal axis represents time. FIG. 2A illustrates a signal at P1 after a signal to be transmitted is inputted to the transistor Tr1. As shown in FIG. 2A, the signal inputted repeats the high level and the low level periodically, and the transistor Tr1 turns on when the signal is high and turns off when it is low. To the transistor Tr2, a signal with its high and low levels inverted against those in FIG. 2A is inputted.

Figure 2B:
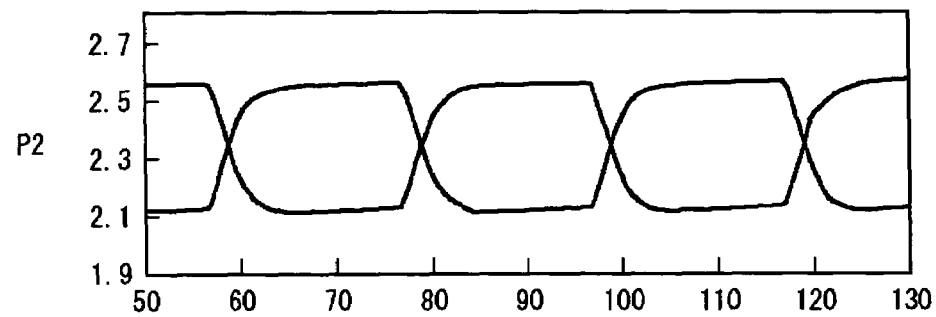
Figure 2C:
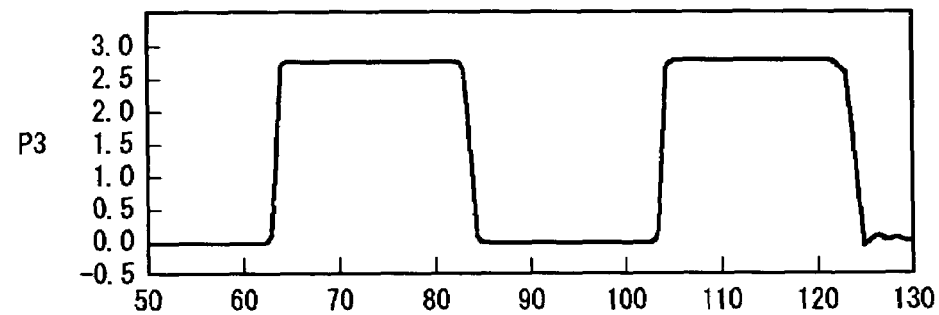

Transmitted signals, which are differential signals, are created by the drive current from the constant-current source 18 and the on and off of the transistor Tr1 and the transistor Tr2 and are transmitted from the first transmitting terminal 24 and the second transmitting terminal 26 to the first receiving terminal 28 and the second receiving terminal 30 via the first signal transmission line 104 and the second signal transmission line 106, respectively. Also, currents from the constant-current source 20 and the constant-current source 22 are delivered to the first signal transmission line 104 and the second signal transmission line 106 via the transistor Tr3 and the transistor Tr4, respectively. The first resistor 36 and the second resistor 38 in the receiving apparatus 108 convert the current signals contained in transmitted signals into their respective voltages. FIG. 2B illustrates the waveform of signals at P2. The signals are further converted by the comparator 44 into an output signal. FIG. 2C illustrates the waveform of a signal at P3.

Figure 2D:
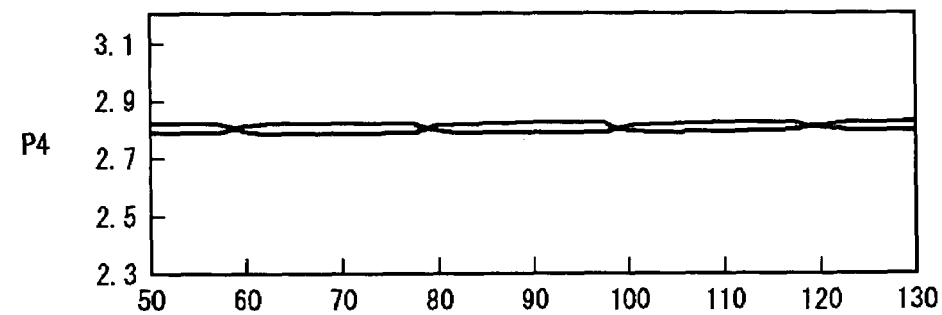
Figure 2E:
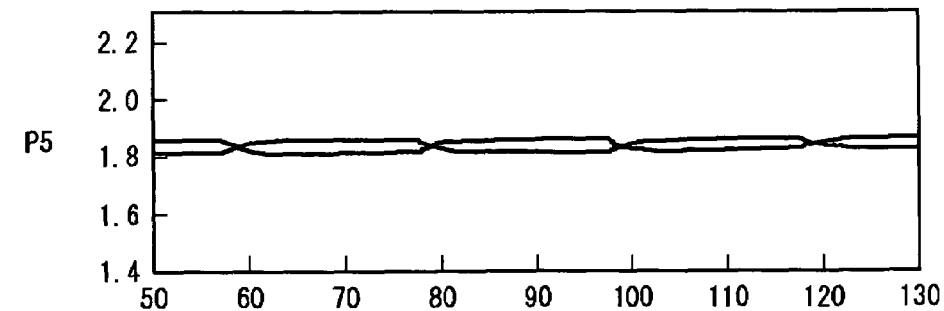

On the other hand, control signals, which are created by dropping the power-supply voltage by the transistor Tr7 and the transistor Tr8 based on the current signals, are illustrated in FIG. 2D, which correspond to the signals at P4. As described earlier, the resistance values of the transistor Tr7 and the transistor Tr8 are set smaller than those of the first resistor 36 and the second resistor 38, so that the variation in amplitude in FIG. 2D is smaller than that in FIG. 2B. The control signals are applied crosswise to the transistor Tr5 and the transistor Tr6 as the gate voltages thereof. FIG. 2E illustrates the source voltages of the transistor Tr5 and the transistor Tr6 at P5, which are the transmitted voltage signals. As is evident, the variations in the transmitted voltage signals are so adjusted as to be small despite the large variations in the voltage extracted from the transmitted signals shown in FIG. 2B.

Figure 3B:
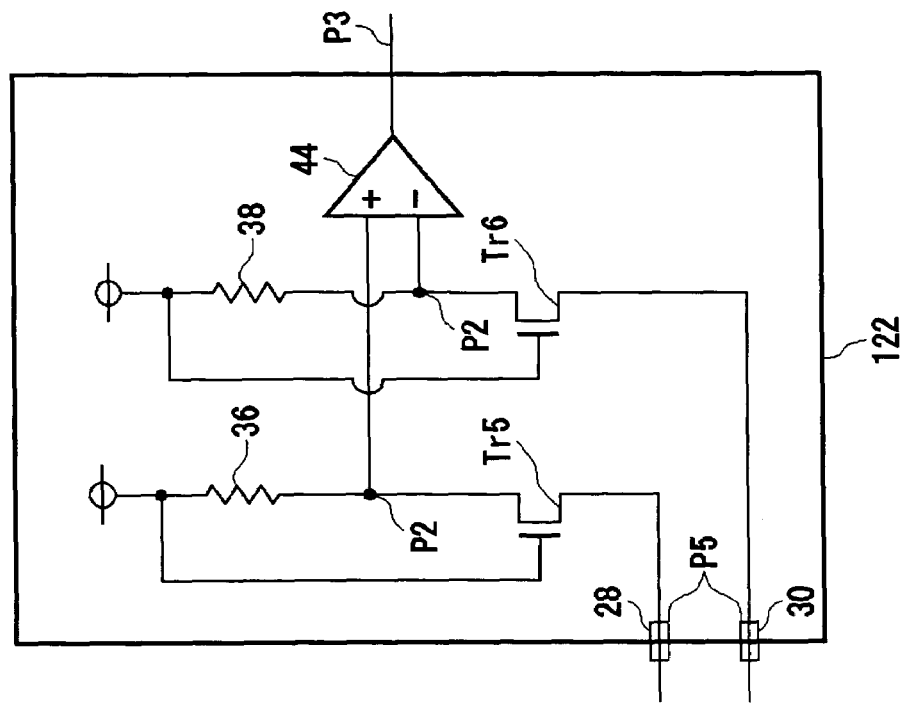
FIGS. 3A and 3B show structures of receiving apparatuses to be compared to the receiving apparatus shown in FIG. 1.
Figure 3A:
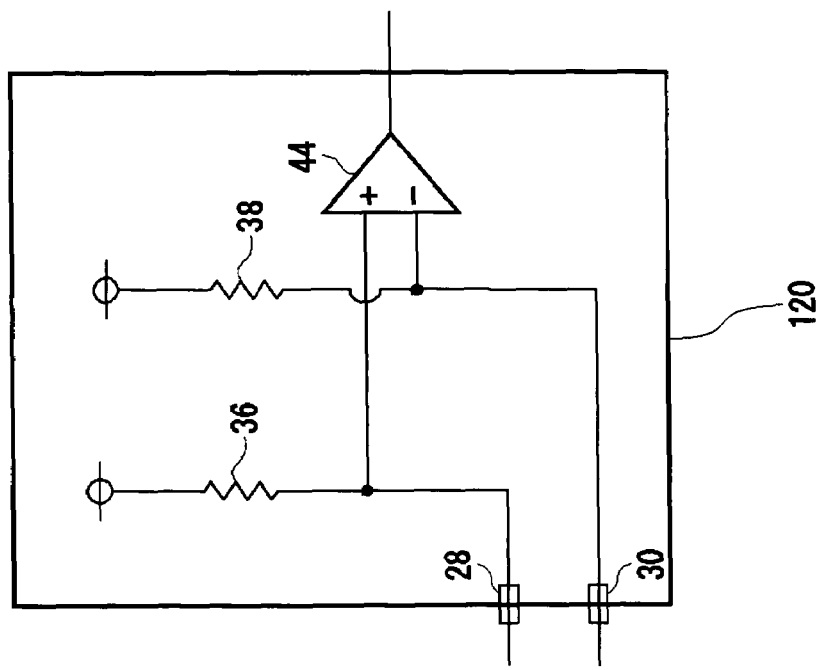

FIGS. 3A and 3B illustrate structures of a receiving apparatus 120 and a receiving apparatus 122, which come in comparison with the receiving apparatus 108 shown in FIG. 1. The effects of the present embodiment is clarified below using the circuit configuration of these circuits shown in FIGS. 3A and 3B. Since the receiving apparatus 120 and the receiving apparatus 122 are both formed by some of the components of the receiving apparatus 108, the explanation thereof is omitted.

The receiving apparatus of FIG. 3A, which mainly includes a first resistor 36 and a second resistor 38, converts current signals contained in transmitted signals into voltages by the first resistor 36 and the second resistor 38 and outputs them as an output signal by a comparator 44. Accordingly, the transmitted voltage signal becomes equal to voltage V1 after the above-mentioned conversion by the first resistor 36, which is represented by Equation (1). The receiving apparatus of FIG. 3B includes a transistor Tr5 and a transistor Tr6 in addition to a first resistor 36 and a second resistor 38, and the gate voltages of the transistor Tr5 and the transistor Tr6 are both fixed to the power-supply voltage. Accordingly, the voltage signals contained in transmitted signals become equal to source voltage V2 of the transistor Tr5, which is represented by Equation (2). It is to be noted, however, that the VG in Equation (2) shall be replaced by VDD.

Figure 4A:
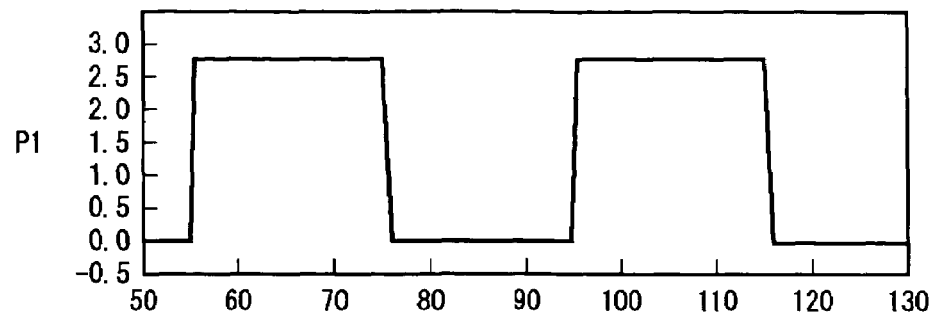
FIGS. 4A to 4D illustrate waveforms signals at P1 of FIG. 1 and P2, P3, P5 of FIG. 3B, respectively.
Figure 4B:
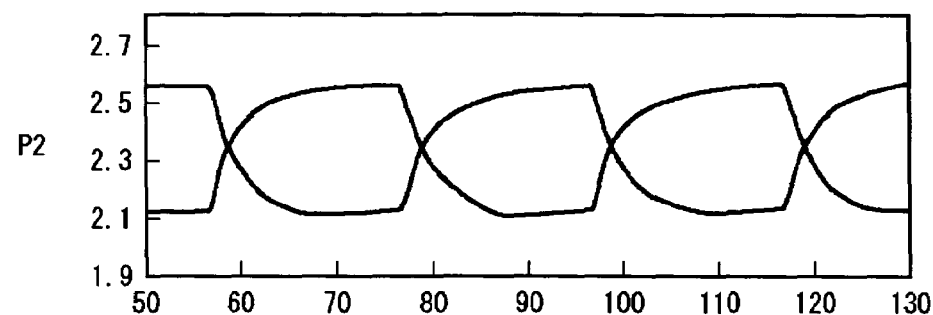
Figure 4C:
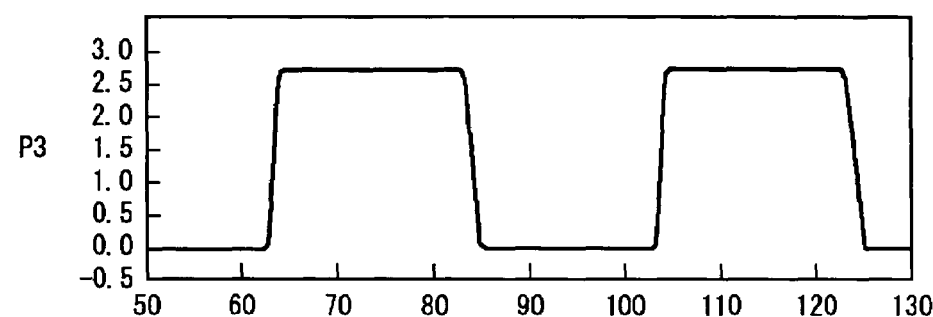
Figure 4D:
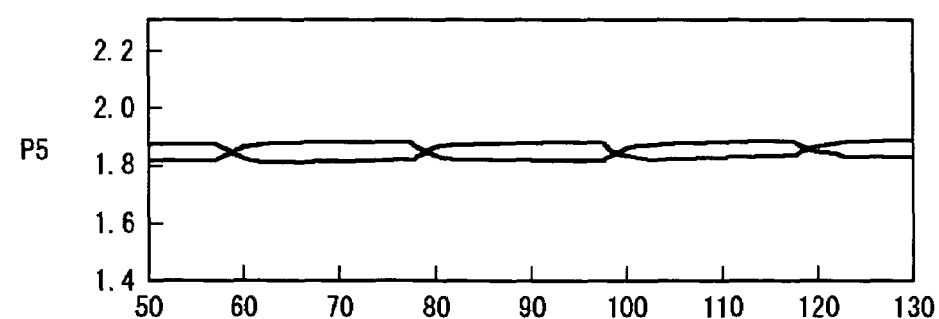

FIGS. 4A to 4D illustrate the waveforms of signals in the receiving apparatus 122, which correspond to those at P1 to P3 and P5 shown in FIG. 1 and FIG. 3B, where the vertical axis represents voltage and the horizontal axis represents time similarly to FIGS. 2A to 2E. FIGS. 4A to 4C are identical to FIGS. 2A to 2C, respectively. In other words, signals to be transmitted and output signals are identical to those according to the present embodiment. FIG. 4D, on the other hand, shows the variations in amplitude of transmitted voltage signals at P5, which are larger than those of FIG. 2E, which corresponds thereto. According to the present embodiment, therefore, the variations in amplitude of transmitted voltage signals can be made smaller while producing the same output signals.

Figure 5:
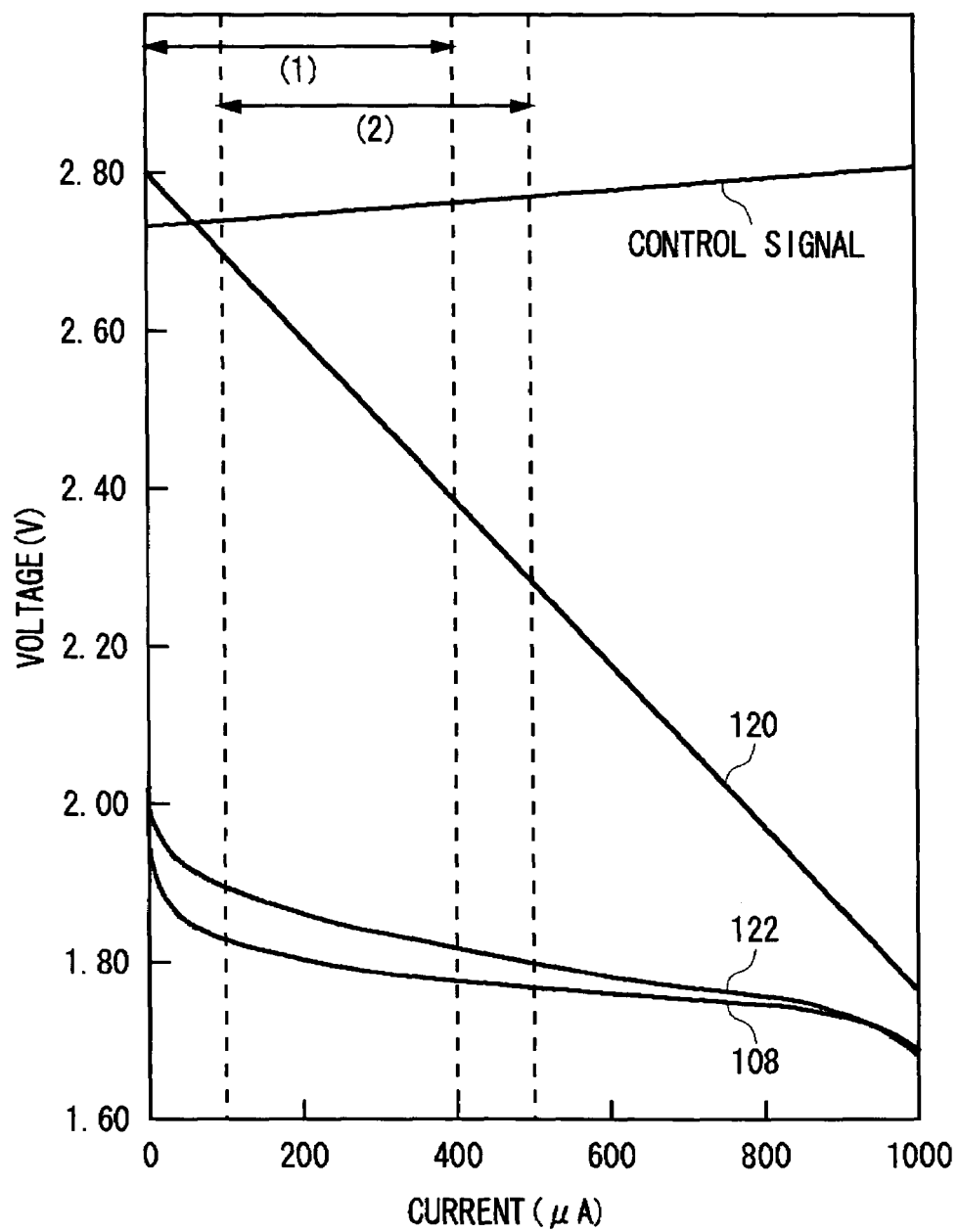
FIG. 5 is a graph showing current-voltage characteristics of a receiving apparatus shown in FIG. 1, a receiving apparatuses shown in FIG. 3A and a receiving apparatus shown in FIG. 3B.

FIG. 5 is a graph showing the current-voltage characteristics of a receiving apparatus 108, a receiving apparatus 120 and a receiving apparatus 122. The vertical axis represents transmitted voltage signals, and the horizontal axis represents current signals contained in the transmitted signals. With the receiving apparatus 120, the transmitted voltage signal changes significantly with the change in the current signal as is implied by Equation (1). As a first step of explanation, the constant-current source 20 and the constant-current source 22 in FIG. 1 are disregarded and the current signals are assumed to change between 0 μA and 400 μA. Then the change in the voltage values corresponding thereto is the variation in the transmitted voltage signals. The transmitted voltage signal of the receiving apparatus 122 changes according to the aforementioned V2, so that there is a smaller change in the transmitted voltage signal according to the change in the current signal than with the receiving apparatus 120. With the receiving apparatus 108, for which the control signals are applied crosswise, the control signals become larger with larger current signals as illustrated. Consequently, the change in the transmitted voltage signal becomes smaller than with the receiving apparatus 122 according to the aforementioned V3.

Though it has been assumed as a first step of explanation that the current signals change between 0 μA and 400 μA, it is now assumed that a current of 100 μA is delivered from the constant-current source 20 and the constant-current source 22 to the first signal transmission line 104 and the second signal transmission line 106 as shown in FIG. 1. Then the current signals change between 100 μA and 500 μA. With the receiving apparatus 108 and the receiving apparatus 122, the variation between the transmitted voltage signals corresponding to the current signals of 100 μA to 500 μA is smaller than the variation between the transmitted voltage signals corresponding to the current signals of 0 μA to 400 μA. That is, the variation in transmitted voltage signals may be further reduced by supplying current that causes the transistor Tr6 and the transistor Tr5 to operate in the saturation region.

According to the present embodiment, the variation in the voltage signals contained in transmitted signals can be reduced. As a result, if the capacity of the signal transmission lines is fixed, then the time for charging and discharging an electric charge according to the capacity is shortened, which can realize high-speed signal transmission. Moreover, the reduced variation in the voltage signals raises the operating frequency, which may also make high-speed signal transmission possible. Furthermore, the signals are transmitted by two signal transmission lines corresponding to the differential signals, so that the number of signal transmission lines required is made smaller, thus raising the degree of freedom of design in the arrangement of the signal transmission lines.

Second Embodiment

A second embodiment according to the present invention provides a structure different from the first embodiment. The second embodiment is characterized by the increased degree of freedom in the structure. Furthermore, the constant-current sources within the transmitting apparatus are turned into a single one, so that transmission signals can be controlled more precisely.

Figure 6:
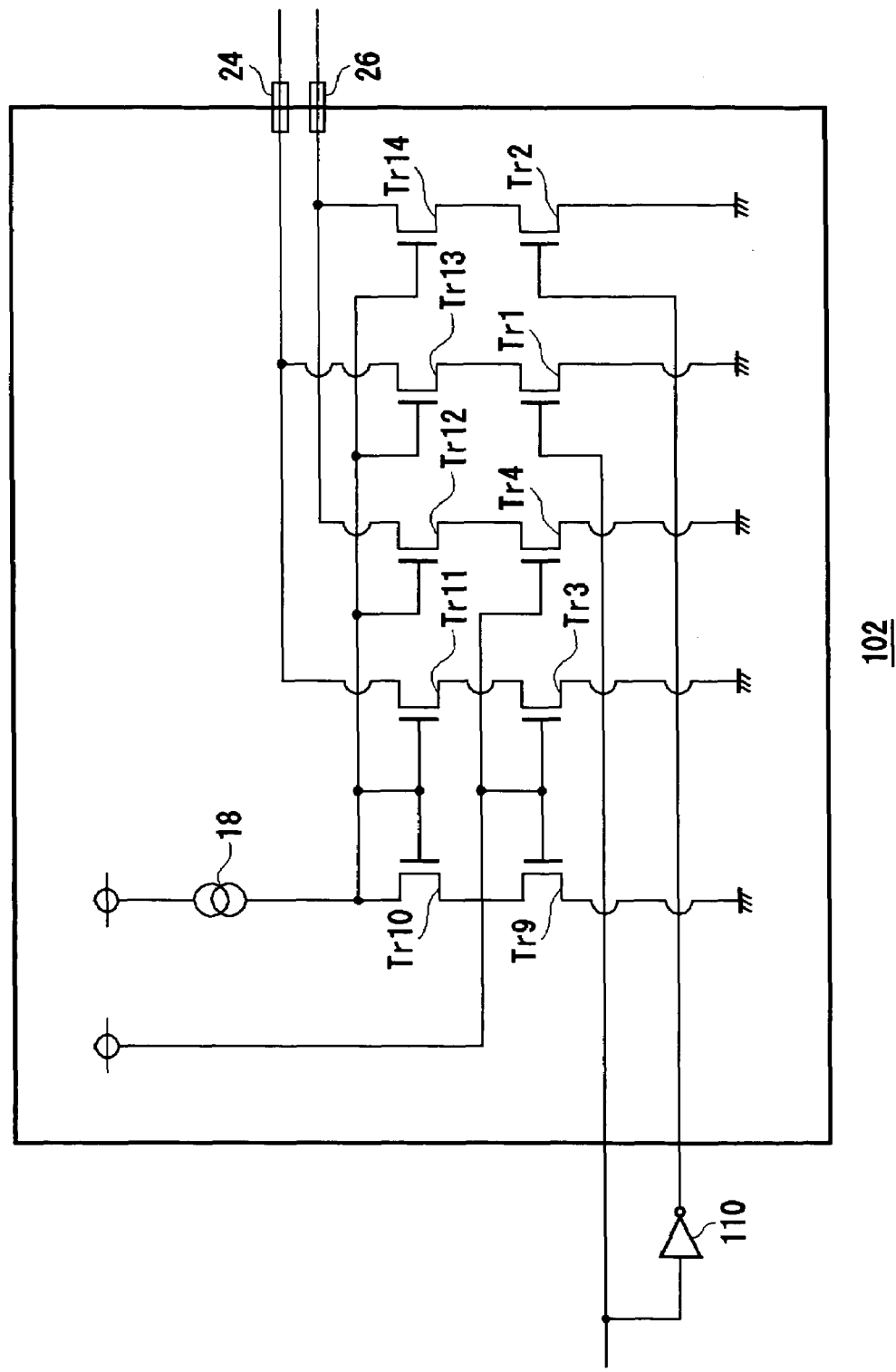
FIG. 6 shows a structure of a transmitting apparatus according to a second embodiment of the present invention.

FIG. 6 shows a structure of a transmitting apparatus 102 according to a second embodiment. The transmitting apparatus 102 according to the second embodiment is structured such that transistors Tr9 to Tr14 are added to the transmitting apparatus 102 shown in FIG. 1 and the constant-current sources 20 and 22 shown in FIG. 1 are eliminated. Since the receiving apparatus 108 shown in FIG. 1 is still effective as a receiving apparatus for the second embodiment, the description thereof is omitted here.

Transistors Tr10 to Tr14 constitute a current mirror circuit. Gate terminals of the transistors Tr10, Tr11 and Tr12, which are connected to one another, are of the same potential. If the same transistor is used for all of the transistors Tr10, Tr11 and Tr12 and for all of transistors Tr9, Tr3 and Tr4, then source terminals of the transistors Tr10, Tr11 and Tr12 will be of the same potential. Hence, the drain currents flowing to the transistors Tr11 and Tr12 are equal.

According to the second embodiment, the magnitude of current flowing to the signal transmission line can be accurately set in accordance with size of a transistor.

Third Embodiment

A third embodiment according to the present invention relates to a transmission apparatus where a transmitting apparatus and a receiving apparatus described in the first embodiment and/or the second embodiment are integrally structured so as to be mounted on an integrated circuit. Since LSI vendors need only to produce the integrally structured transmission apparatus, the transmission apparatuses can be mass-produced instead of manufacturing transmitting apparatuses and receiving apparatuses separately, thus taking the advantages of the mass-production. On the other hand, the so-called set makers, who are specialized in fabricating and assembling the transmission apparatus into electronic equipment such as cellular phones, set to either the transmitting apparatus or the receiving apparatus at the time of mounting and assembling them. The transmission apparatus according to the third embodiment selects either the transmitting apparatus or the receiving apparatus in a manner such that the gate voltage applied to transistors used to control the signals and so forth in the transmitting apparatus and the receiving apparatus is set to a predetermined value.

Figure 7:
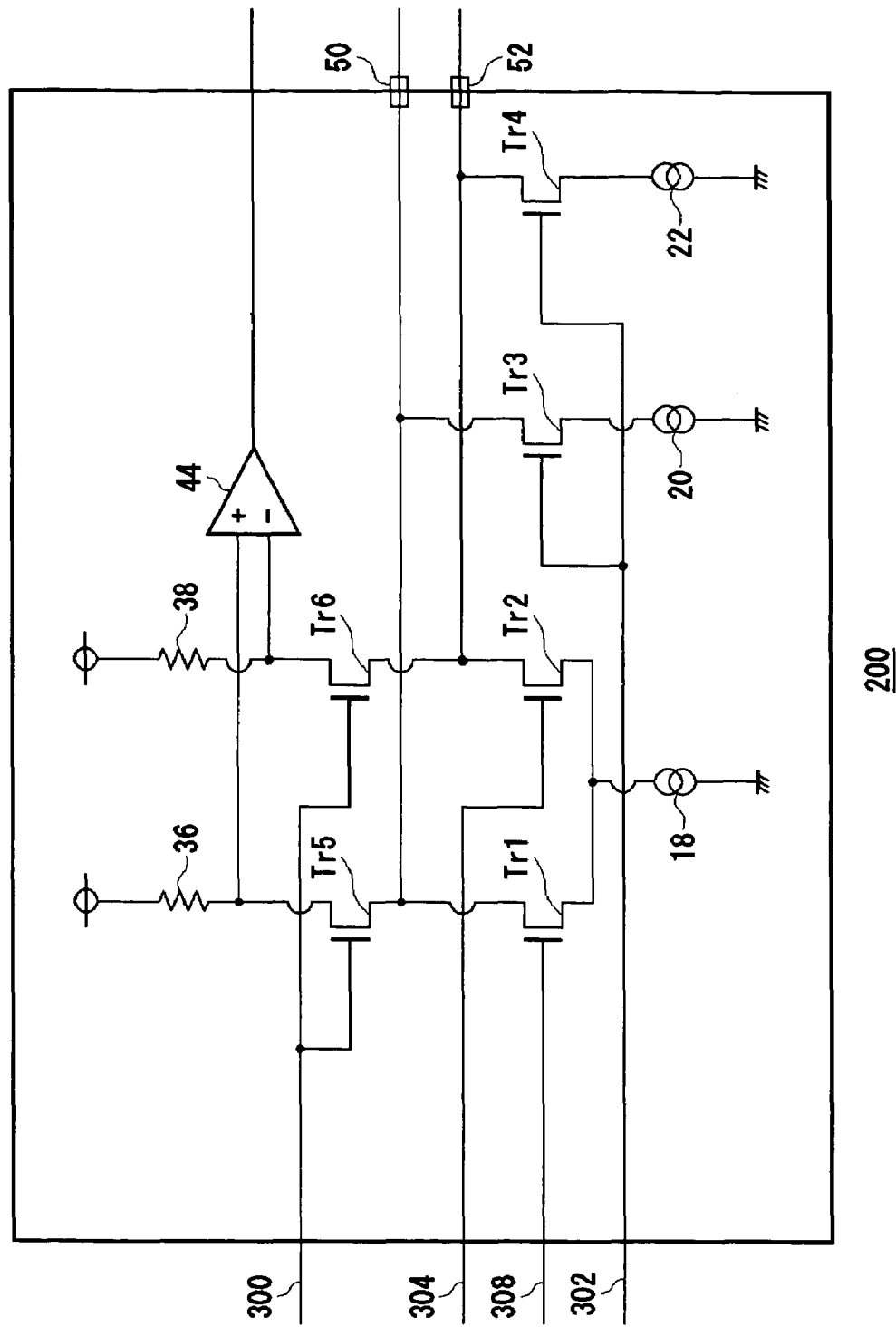
FIG. 7 shows a structure of a transmission apparatus according to a third embodiment of the present invention.

FIG. 7 shows a structure of a transmission apparatus 200 according to the third embodiment. The same components of the transmission apparatus 200 contained also in the transmission apparatus of FIG. 1 are given the same reference numerals as those in FIG. 1. The transmission apparatus 200 further includes a first terminal 50, a second terminal 52, a receiving switch signal line 300, a transmitting switch signal line 302, a first transmitting signal line 304 and a second transmitting signal line 308.

An inverter 110, a transistor Tr1, a transistor Tr2, a transistor Tr3, a transistor Tr4, a constant-current source 20 and a constant-current source 22 correspond to those of the transmitting apparatus 102 shown in FIG. 1, respectively, and operate the same way as in the transmitting apparatus 102. On the other hand, a transistor Tr5, a transistor Tr6, a first resistor 36, a second resistor 38 and a comparator 44 correspond to those, which are partially modified, of the receiving apparatus 108 shown in FIG. 1. The first terminal 50 corresponds to the first transmitting terminal 24 and first receiving terminal 28 shown in FIG. 1, and a second terminal 52 corresponds to the second transmitting terminal 26 and second receiving terminal 30 thereof.

The gate voltages of the transistor Tr5 and the transistor Tr6 differ from those of the receiving apparatus 108. That is, the power-supply voltage is fixedly applied thereto via the receiving switch signal line 300. In other words, the gate voltage is not adjusted in accordance with the magnitude of current signals, so that the transmission signal voltage is represented by V2 and the variation in the transmission signal voltage becomes somewhat larger that of receiving apparatus 108. Nevertheless, an advantage achieved thereby is that the circuit structure can be made easier and simpler.

According to values of gate voltages to be inputted to a receiving switch signal line 300, a transmitting switch signal line 302, a first receiving signal line 304 and a second transmitting signal line 308, it is determined whether the transmission apparatus 200 is used as a transmitting apparatus or a receiving apparatus. When the transmission apparatus 200 is used as a transmitting apparatus, a high-level voltage by which to turn the transistor Tr3 and the transistor Tr4 on is applied to the transmitting switch signal line 302, and signals to be transmitted are inputted to the first transmitting signal line 304 and the second transmitting line 308, respectively. And a low-level voltage by which to turn the transistor Tr5 and the transistor Tr6 off is applied to the receiving switch signal line 300. In this case, the first terminal 50 and the second terminal 52 function as the first transmitting terminal 24 and the second transmitting terminal 26, respectively. When the transmission apparatus 200 is used as a receiving apparatus, a low-level voltage by which to turn the transistor Tr3 and the transistor Tr4 off is applied to the transmitting switch signal line 302. And a voltage by which to turn both the transistor Tr1 and the transistor Tr2 off is applied to the first transmitting signal line 304 and the second transmitting signal line 308, whereas a high-level voltage by which to turn the transistor Tr5 and the transistor Tr6 on is applied to the receiving switch signal line 300. In this case, the first terminal 50 and the second terminal 52 function as the first receiving terminal 28 and the second receiving terminal 30, respectively. It is assumed here that the high-level voltage is the power-supply voltage whereas the low-level voltage is the ground level.

Figure 8:
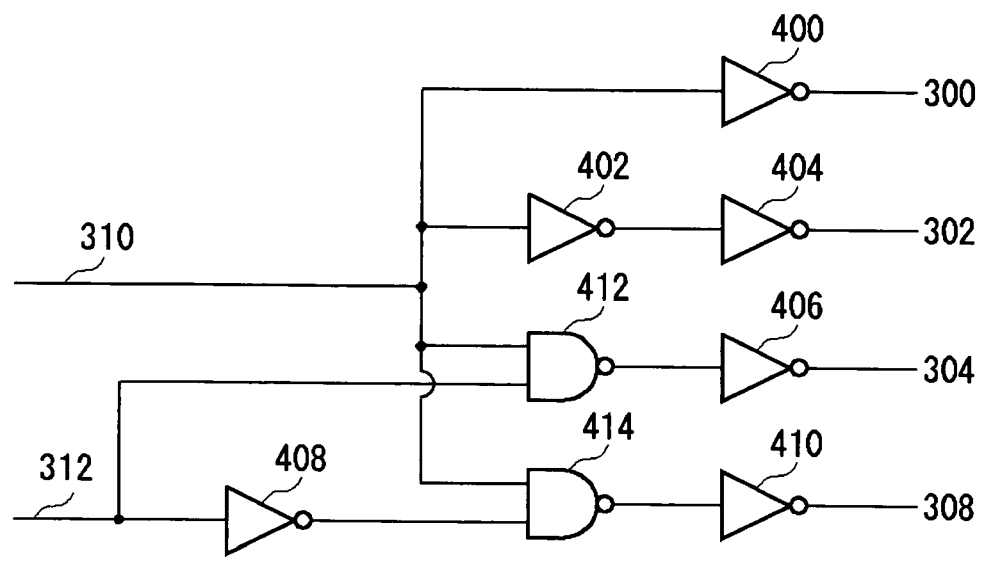
FIG. 8 shows a structure of the switch unit used in the transmission apparatus shown in FIG. 7.

FIG. 8 illustrates a structure of a switch unit 250 used in the transmission apparatus 200. The switch unit 250 includes inverters 400, 402, 404, 406, 408 and 410, a NAND circuit 412, a NAND circuit 414, a transmit/receive switch signal line 310 and an input signal line 312. It is to be noted that a structure may be such that the switch unit 250 is included in the transmission apparatus 200.

The input signal line 312 transmits signals which are to be transmitted by the first transmitting signal line 304 and the second transmitting signal line 308.

A voltage is applied through the transmit/receive switch signal line 310 to switch the use of the transmission apparatus 200 between as the transmitting apparatus or the receiving apparatus. Based on a signal through the transmit/receive switch signal line 310, the switch unit 250 generates signals to be delivered to the receiving switch signal line 300, transmitting switch signal line 302, first transmitting signal line 304 and second transmitting signal line 308 so as to switch the transmit/receive function in the transmission apparatus 200. Suppose that the transmit/receive switch signal line 310 is at high level. Then the receiving switch signal line 300 goes low-level, the transmitting switch signal line 302 goes high-level, and the levels of first transmitting signal line 304 and the second transmitting signal line 308 change according to the input signal line 312, so that the transmission apparatus 200 operates as a transmitting apparatus. Suppose, on the other hand, that the transmit/receive switch signal line 310 is at low level. Then the receiving switch signal line 300 goes high-level, the transmitting switch signal line 302 goes low-level, and the first transmitting signal line 304 and the second transmitting signal line 308 go low-level, so that the transmission apparatus 200 operates as a receiving apparatus.

According to the third embodiment, the terminals that input and output signals can be put to a common use in the transmission apparatus where the transmitting apparatus and the receiving apparatus are integrally structured, so that the number of terminals can be reduced. Moreover, part of signal lines leading to a terminal can be commonly used, so that the area occupied by the signal lines can be reduced.

Fourth Embodiment

Similar to the third embodiment, a fourth embodiment according to the present invention relates to a transmission apparatus where a transmitting apparatus and a receiving apparatus are integrally structured so as to be mounted on an integrated circuit. However, since in this fourth embodiment the receiving apparatus according to the first embodiment is employed as a receiving apparatus, the fourth embodiment is more applicable to and suitable for the use in high-speed transmission than the third embodiment.

Figure 9:
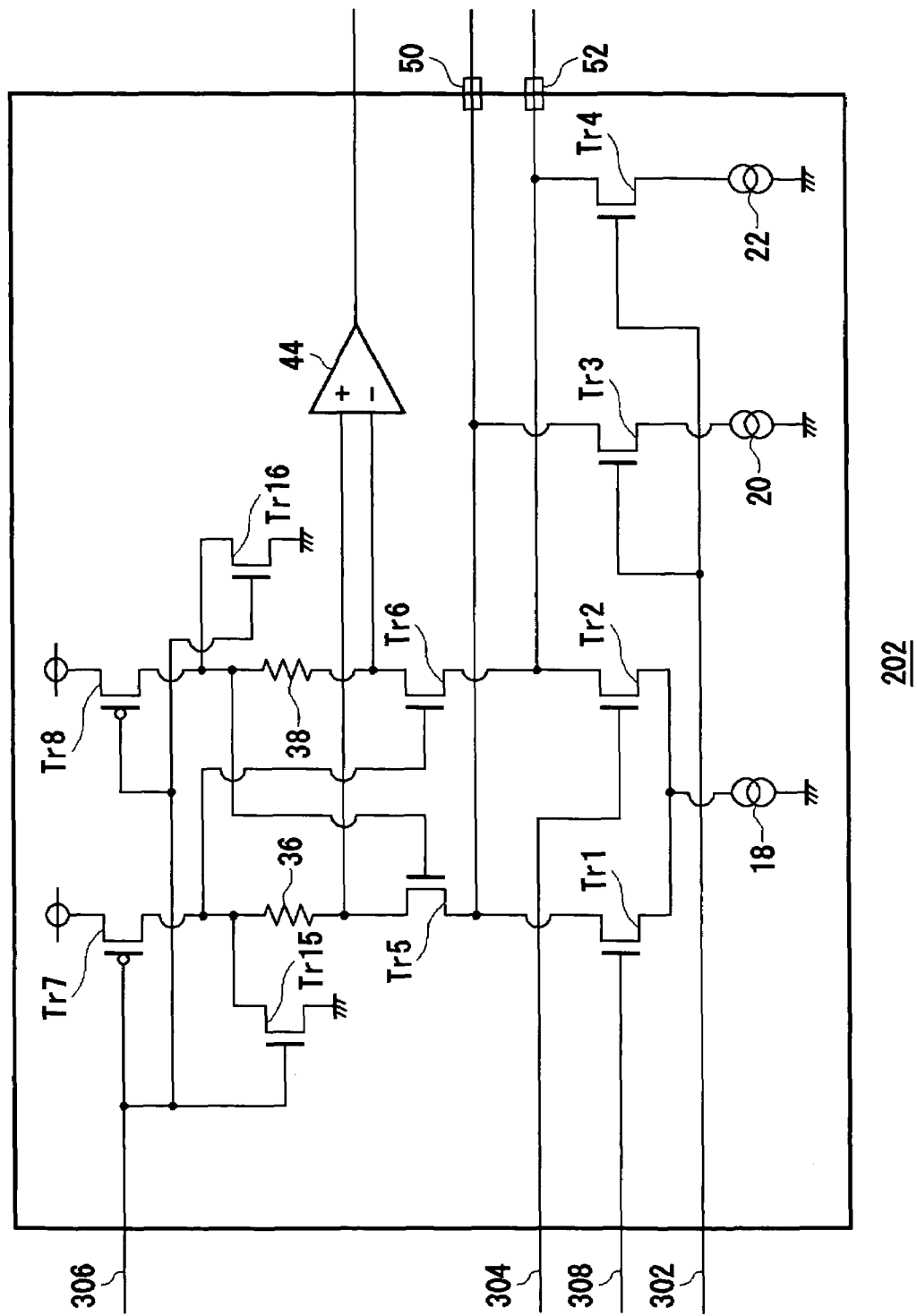
FIG. 9 shows a structure of a transmission apparatus according to a fourth embodiment of the present invention.

FIG. 9 shows a structure of a transmission apparatus 202 according to the fourth embodiment. The same components of the transmission apparatus 202 contained in the transmission apparatus of FIG. 9 are given the same reference numerals as those in FIG. 1. The transmission apparatus 202 further includes a transmitting switch signal line 306, a transistor Tr15 and a transistor Tr16.

A transmitting switch signal line 306 corresponds to the receiving switch signal line 300 of FIG. 8, and inputs voltage to switch on and off the operation of a receiving apparatus contained in the transmission apparatus 202. However, the on-off switching of an operation of the receiving apparatus according to voltage of the transmitting switch signal line 306 is opposite to that of the receiving switch signal line 300. That is, when the transmitting switch signal line 306 is at high level, the receiving apparatus turns off while when the transmitting switch signal line 306 is at low level, the receiving apparatus turns on.

The transistor Tr15 and the transistor Tr16 are provided to fix the gate voltages of the transistor Tr5 and the transistor Tr6 to the ground level when the receiving apparatus is turned off. Similar to the transmission apparatus 200 shown in FIG. 7, the switch unit 250 may be applied to or built into the transmission apparatus 202.

According to the fourth embodiment, the terminals that input and output signals can be put to a common use in the transmission apparatus where the transmitting apparatus and the receiving apparatus are integrally structured, so that the number of terminals can be reduced. Moreover, part of signal lines leading to a terminal can be commonly used, so that the area occupied by the signal lines can be reduced. Since the variation in voltage signals in external signal lines can be made small, the high-speed transmission of signals can be achieved.

Fifth Embodiment

A fifth embodiment relates to a cellular phone which employs and implements a transmission apparatus of the third or fourth embodiment. The above-described transmission apparatuses make possible the high-speed transmission of signals. Thus, even if the capacitance of signals to be transmitted increases, they can be transmitted as serial signals. As a result, the number of signal transmission lines to be wired is reduced. Thus, even if the signal transmission lines must pass through the movable mechanism, the arrangement and placement of the signal transmission lines can be made with ease.

Figure 10:
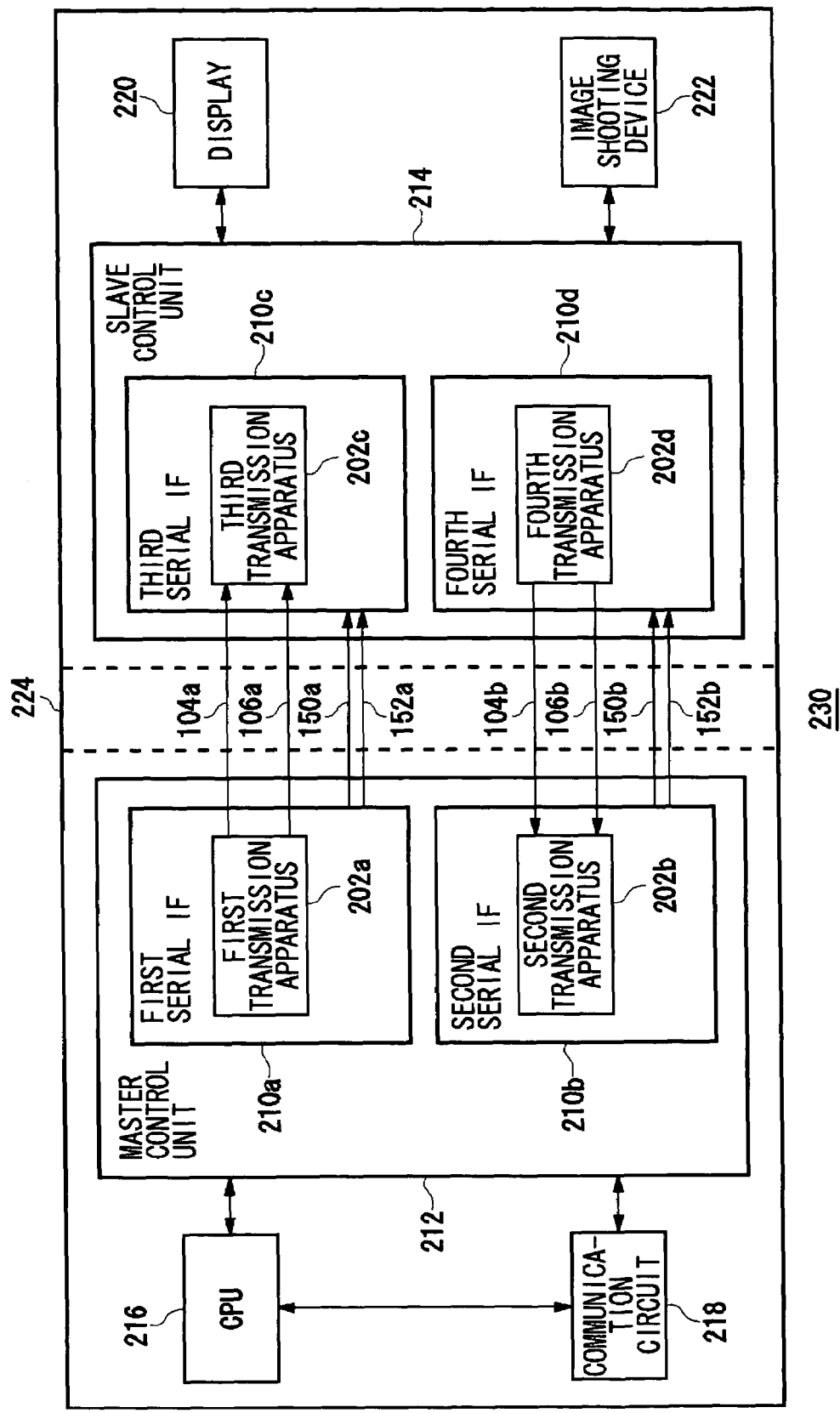
FIG. 10 shows a structure of a cellular phone according to a fifth embodiment of the present invention.

FIG. 10 shows a structure of a cellular phone 230 according to a fifth embodiment. The cellular phone 230 includes therein a CPU 216, a communication circuit 218, a master control unit 212, a movable mechanism 224, a slave control unit 214, a display 220, an image shooting device 222, an eleventh signal transmission line 104a, a twenty-first signal transmission line 104b, a twelfth signal transmission line 106a, a twenty-second signal transmission line 106b, an eleventh clock line 150a, a twenty-first clock line 150b, a twelfth clock line 152a and a twenty-second clock line 152b. The master control unit 212 includes a first serial interface (IF) 210a, a second serial interface (IF) 210b. The slave control unit 214 includes a third serial interface (IF) 210c and a fourth serial interface (IF) 210d. The first serial IF 210a includes a first transmission apparatus 202a. The second serial IF 210b includes a second transmission apparatus 202b. The third serial IF 210c includes a third transmission apparatus 202c. The fourth serial IF 210d includes a fourth transmission apparatus 202d.

The first serial IF 210a, the second serial IF 210b, the third serial IF 210c and the fourth serial IF 210d are generically called the serial IF 210. The first transmission apparatus 202a, the second transmission apparatus 202b, the third transmission apparatus 202c and the fourth transmission apparatus 202d are generically called the transmission apparatus 202. The eleventh signal transmission line 104a and the twenty-first signal transmission line 104b are generically called the first signal transmission line 104 whereas the twelfth signal transmission line 106a and the twenty-second signal transmission line 106b are generically called the second signal transmission line 106. The eleventh clock line 150a and the twenty-first clock line 150b are generically called the first clock line 150 whereas the twelfth clock line 152a and the twenty-second clock line 152b are generically called the second clock line 152.

The body of cellular phone 230 is such that a movable mechanism 224 is provided in the middle part thereof and the casing thereof is foldable. Circuits of various functions are mounted on both the left-side part and the right-side part of the casing with the movable mechanism 224 as a center. Here, the left part of the casing is called a master casing whereas the right part of the casing is called a slave casing, and both parts of the casing mutually transmit the signals by the transmission apparatuses described in the above-described embodiments.

The communication circuit 218 carries out communication processings in a cellular phone. The display 220 displays predetermined information. The image shooting device 222 shoots still images or moving images and compresses the still images or moving images shot. The CPU 216 controls these functions and executes application programs.

The master control unit 212 and the slave control unit 214 carries signals between the master casing and the slave casing. Since parallel signals are used for the signal transmission between the CPU 216 and the communication circuit 218 whereas serial signals are used for the signal transmission between the master control unit 212 and the slave control unit 214, the master control unit 212 converts signal formats among them. The master control unit 212 also carries out a timing control for the signal transmission and so forth. The slave control unit 214 performs similarly, but the timing control is done by the master control unit 212.

The first serial IF 210a provides a transmitting function for the signal transmission from the master casing to the slave casing whereas the third serial IF 210c provides a receiving function therefor. The fourth serial IF 210d, on the other hand, provides a transmitting function for the signal transmission from the salve casing to the master casing whereas the second serial IF 210b provides a receiving function therefor. In particular, the first transmission apparatus 202a is set as a transmitting apparatus and the third transmission apparatus 202c is set as a receiving apparatus as described above, so that the signals are transmitted via the eleventh signal transmission line 104a and the twelfth signal transmission line 106a. At that time, the clock signal for transmitting signals is transmitted from the first serial IF 210a to the third serial IF 210c as a differential signal via the eleventh clock signal 150a and the twelfth clock signal 152a. On the other hand, the fourth transmission apparatus 202d is set as a transmitting apparatus and the second transmission apparatus 202b is set as a receiving apparatus as described above, so that the signals are transmitted via the twenty-first signal transmission line 104b and the twenty-second signal transmission line 106b. At that time, the clock signal for transmitting signals is transmitted from the second serial IF 210b to the fourth serial IF 210d as a differential signal via the twenty-first clock signal 150b and the twenty-second clock signal 152b.

By employing the fifth embodiment, the serial signal transmission capable of transmitting the high-speed signals can be realized, thus reducing the number of signal transmission lines required and increasing the degree of freedom of arranging the signal transmission lines.

Next, the structure according to the present embodiments will be described with reference to claim phraseology by way of exemplary component arrangement. An "input unit" corresponds to the first receiving terminal 28 and the second receiving terminal 30. An "output signal generator" corresponds to the first resistor 36 and the second resistor 38. A "first control signal generator" corresponds to the transistor Tr7 whereas a "second control signal generator" the transistor Tr8. A "first voltage adjusting unit" corresponds to the transistor Tr5 whereas a "second voltage adjusting unit" the transistor Tr6. An "output unit" corresponds to the comparator 44.

A "first switch unit" corresponds to the transistor Tr1 whereas a "second switch unit" the transistor Tr2. A "main current supply unit" corresponds to the constant-current source 18 whereas a "subordinate current supply unit" the constant-current source 20 and the constant-current source 22.

The present invention has been described based on the embodiments, and the above first to sixth embodiments are only exemplary. It is therefore understood by those skilled in the art that there exist other various modifications to the combination of each component and process described above and that such modifications are encompassed by the scope of the present invention.

In the first and the second embodiment, the transistor Tr7 and the transistor Tr8 are p-channel type field-effect transistors. However, the present invention is not limited thereto and the transistor Tr7 and the transistor Tr8 may be resistors, for instance. According to this modified example, a circuit element can be selected in accordance with the characteristic. That is, it suffices if the power supply voltage can be dropped.

In the first and the second embodiment, the transistors Tr7 and the first resistor 36 are connected in series, and the transistor Tr8 and the second resistor 38 are connected in series. However, the present invention is not limited thereto. And the transistor Tr7 and the first resistor 36 may be connected in parallel, the transistor Tr7 may be placed between the power-supply voltage and the gate terminal of transistor Tr6, and the first resistor 36 may be connected to the power-supply voltage and the drain terminal of transistor Tr5, for instance. The transistor Tr8 and the second resistor 38 may also be connected in the similar manner. According to this modified example, it is possible to realize a circuit arrangement according to the characteristic. That is, it suffices if the first resistor 36 and the second resistor 38 have a function of converting current signals to voltages and the transistor Tr7 and the transistor Tr8 have a function of generating control signals.

In the third and the fourth embodiment, either the transmitting function or the receiving function is selected. However, the present invention is not limited thereto and neither the transmitting function nor the receiving function may be selected, for instance. For example, when N transmission apparatuses are communicating with one transmission apparatus and the N transmission apparatuses are time-division multiplexed, both the transmitting function and the receiving function may be turned off during the period when any of the respective N transmission apparatuses is/are not communicating. In such a case, instead of the switch unit 250 a control device will be provided which switches the transmitting function and the receiving function individually. In other words, it suffices as long as the transmission of signals according to the communication mode is carried out.

In the third and the fourth embodiment, the transmitting apparatus 102 according to the second embodiment may be employed in substitution for the structure comprising the transistors Tr1 to Tr4, the constant-current source 18, the constant-current source 20 and the constant-current source 22. By employing this modified example, the magnitude of the current to be delivered to the signal transmission line can be accurately set according to the size of a transistor.

In the fifth embodiment, the transmission apparatus 200 may be employed instead of the transmission apparatus 202. With this modified example, the circuit structure becomes simplified.

Although the present invention has been described by way of exemplary embodiments, it should be understood that many changes and substitutions may further be made by those skilled in the art without departing from the scope of the present invention which is defined by the appended claims.

What is claimed is:

1. A receiving apparatus, including:
   an input unit which inputs a first input signal and a second input signal, respectively;
   an output signal generator which generates a first output signal from a current signal of the first input signal and which generates a second output signal from a current signal of the second input signal;
   a first control signal generator which generates a first control signal where a reference voltage is dropped by a potential difference which is generated by delivering the current signal of the first input signal;
   a second control signal generator which generates a second control signal where the reference voltage is dropped by a potential difference which is generated by delivering the current signal of the second input signal;
   a first voltage adjusting unit which adjusts, by the second control signal, a magnitude of a voltage signal of the first input signal in said input unit according to a magnitude of the current signal of the first input signal;
   a second voltage adjusting unit which adjusts, by the first control signal, a magnitude of a voltage signal of the second input signal in said input unit according to a magnitude of the current signal of the second input signal; and
   an output unit which outputs a voltage signal according to a difference between the first output signal and the second output signal.

2. A receiving apparatus according to claim 1, wherein said output signal generator causes the reference voltage to drop by the potential difference, which is generated by delivering the current signal of the first input signal, and generates the first output signal in a manner such that a voltage value thereof is equal to or less than that of the first control signal and wherein said output signal generator also causes the reference voltage to drop by the potential difference, which is generated by the current signal of the second input signal, and generates the second output signal in a manner such that a voltage value thereof is equal to or less than that of the second control signal.

3. A receiving apparatus according to claim 1,
wherein the first input signal and the second input signal inputted to said input unit are differential signals which are generated from the original signal that fluctuates and which are complementary to each other,
   wherein said first control signal generator generates the first control signal in such a manner that voltage of the first control signal becomes large when the current signal of the first input signal becomes small,
   wherein said second control signal generator generates the second control signal in such a manner that voltage of the second control signal becomes large when the current signal of the second input signal becomes small,
   wherein when the current signal of the first input signal becomes small, said first voltage adjusting unit adjusts to diminish a variation in the magnitude of the voltage signal of the first input signal in said input unit in such a manner that the second control signal whose voltage is made large by said second control signal generator is applied to the voltage signal of the first input signal in said input unit, and
   wherein when the current signal of the second input signal becomes small, said second voltage adjusting unit adjusts to diminish a variation in the magnitude of the voltage signal of the second input signal in said input unit in such a manner that the first control signal whose voltage is made large by said first control signal generator is applied to the voltage signal of the second input signal in said input unit.

4. A receiving apparatus according to claim 2,
   wherein the first input signal and the second input signal inputted to said input unit are differential signals which are generated from the original signal that fluctuates and which are complementary to each other, wherein said first control signal generator generates the first control signal in such a manner that voltage of the first control signal becomes large when the current signal of the first input signal becomes small, wherein said second control signal generator generates the second control signal in such a manner that voltage of the second control signal becomes large when the current signal of the second input signal becomes small, wherein when the current signal of the first input signal becomes small, said first voltage adjusting unit adjusts to diminish a variation in the magnitude of the voltage signal of the first input signal in said input unit in such a manner that the second control signal whose voltage is made large by said second control signal generator is applied to the voltage signal of the first input signal in said input unit, and wherein when the current signal of the second input signal becomes small, said second voltage adjusting unit adjusts to diminish a variation in the magnitude of the voltage signal of the second input signal in said input unit in such a manner that the first control signal whose voltage is made large by said first control signal generator is applied to the voltage signal of the second input signal in said input unit.

5. A receiving apparatus according to claim 1, wherein said first voltage adjusting unit is constituted by a transistor, which operates in a saturation region, and wherein said second voltage adjusting unit is constituted by a transistor, which operates in a saturation region.

6. A receiving apparatus according to claim 2, wherein said first voltage adjusting unit is constituted by a transistor, which operates in a saturation region, and wherein said second voltage adjusting unit is constituted by a transistor, which operates in a saturation region.

7. A receiving apparatus according to claim 3, wherein said first voltage adjusting unit is constituted by a transistor, which operates in a saturation region, and wherein said second voltage adjusting unit is constituted by a transistor, which operates in a saturation region.

8. A receiving apparatus according to claim 1, wherein said first control signal generator is constituted by a transistor whose gate terminal is grounded and wherein said second control signal generator is constituted by a transistor whose gate terminal is grounded.

9. A receiving apparatus according to claim 2, wherein said first control signal generator is constituted by a transistor whose gate terminal is grounded and wherein said second control signal generator is constituted by a transistor whose gate terminal is grounded.

10. A receiving apparatus according to claim 3, wherein said first control signal generator is constituted by a transistor whose gate terminal is grounded and wherein said second control signal generator is constituted by a transistor whose gate terminal is grounded.

11. A transmission apparatus, including:
a first switch unit which outputs a first transmission signal to a first transmission line by switching said first switch itself on according to an original signal;
a second switch which outputs a second transmission signal to a second transmission line by alternately switching on said first switch unit and said second switch itself;
a main current supply unit which delivers drive current that actuates said first switch unit or said second switch unit which is switched on;
a subordinate current supply unit which delivers complementary drive current to the first transmission line and the second transmission line regardless of operation by said first switch unit and said second switch unit;
an output unit which generates an output signal corresponding to the original signal from a potential difference between a first intermediate signal generated from a current signal of the first transmission signal and a second intermediate signal generated from a current signal of the second transmission signal and which outputs the thus generated output signal;
a first control signal generator which generates a first control signal where a reference voltage is dropped by a potential difference generated by delivering the current signal of the first transmission signal;
a second control signal generator which generates a second control signal where the reference voltage is dropped by a potential difference generated by delivering the current signal of the second transmission signal;
a first voltage adjusting unit which adjusts, by the second control signal, a magnitude of a voltage signal of the first transmission signal in the first transmission line according to a magnitude of the current signal of the first transmission signal; and
a second voltage adjusting unit which adjusts, by the first control signal, a magnitude of a voltage signal of the second transmission signal in the second transmission line according to a magnitude of the current signal of the second transmission signal.

12. A transmission apparatus according to claim 11, wherein in order to generate the first intermediate signal said output unit causes to drop the reference voltage by a potential difference which is generated by delivering the current signal of the first transmission signal and which is also equal to or greater than a potential difference generated by said first control signal generator and wherein in order to generate the second intermediate signal said output unit causes to drop the reference voltage by a potential difference which is generated by delivering the current signal of the second transmission signal and which is also equal to or greater than a potential difference generated by said second control signal generator.

13. A transmission apparatus according to claim 11, wherein said first control signal generator generates the first control signal in such a manner that voltage of the first control signal becomes large when the current signal of the first transmission signal becomes small, wherein said second control signal generator generates the second control signal in such a manner that voltage of the second control signal becomes large when the current signal of the second transmission signal becomes small, wherein when the current signal of the first transmission signal becomes small, said first voltage adjusting unit adjusts to diminish a variation in the magnitude of the voltage signal of the first transmission signal in the first transmission line in such a manner that the second control signal whose voltage is made large by said second control signal generator is applied to the voltage signal of the first transmission signal in the first transmission line, and wherein when the current signal of the second transmission signal becomes small, said second voltage adjusting unit adjusts to diminish a variation in the magnitude of the voltage signal of the second transmission signal in the second transmission line in such a manner that the first control signal whose voltage is made large by said first control signal generator is applied to the voltage signal of the second transmission signal in the second transmission line.

14. A transmission apparatus according to claim 12, wherein said first control signal generator generates the first control signal in such a manner that voltage of the first control signal becomes large when the current signal of the first transmission signal becomes small, wherein said second control signal generator generates the second control signal in such a manner that voltage of the second control signal becomes large when the current signal of the second transmission signal becomes small, wherein when the current signal of the first transmission signal becomes small, said first voltage adjusting unit adjusts to diminish a variation in the magnitude of the voltage signal of the first transmission signal in the first transmission line in such a manner that the second control signal whose voltage is made large by said second control signal generator is applied to the voltage signal of the first transmission signal in the first transmission line, and wherein when the current signal of the second transmission signal becomes small, said second voltage adjusting unit adjusts to diminish a variation in the magnitude of the voltage signal of the second transmission signal in the second transmission line in such a manner that the first control signal whose voltage is made large by said first control signal generator is applied to the voltage signal of the second transmission signal in the second transmission line.

15. A transmission apparatus according to claim 11, wherein said first voltage adjusting unit is constituted by a transistor, which operates in a saturation region, and wherein said second voltage adjusting unit is constituted by a transistor, which operates in a saturation region.

16. A receiving apparatus according to claim 12, wherein said first voltage adjusting unit is constituted by a transistor, which operates in a saturation region, and wherein said second voltage adjusting unit is constituted by a transistor, which operates in a saturation region.

17. A receiving apparatus according to claim 13, wherein said first voltage adjusting unit is constituted by a transistor, which operates in a saturation region, and wherein said second voltage adjusting unit is constituted by a transistor, which operates in a saturation region.

18. A receiving apparatus according to claim 11, wherein said first control signal generator is constituted by a transistor whose gate terminal is grounded and wherein said second control signal generator is constituted by a transistor whose gate terminal is grounded.

19. A receiving apparatus according to claim 12, wherein said first control signal generator is constituted by a transistor whose gate terminal is grounded and wherein said second control signal generator is constituted by a transistor whose gate terminal is grounded.

20. A receiving apparatus according to claim 13, wherein said first control signal generator is constituted by a transistor whose gate terminal is grounded and wherein said second control signal generator is constituted by a transistor whose gate terminal is grounded.

\* \* \* \* \*